(12) United States Patent
Liaw et al.

(10) Patent No.: US 6,177,338 B1
(45) Date of Patent: Jan. 23, 2001

(54) TWO STEP BARRIER PROCESS

(75) Inventors: Jhon-Jhy Liaw, Taipei; Ching-Yau Yang, Changhua, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/246,894

(22) Filed: Feb. 8, 1999

(51) Int. Cl.[7] .................................................. H01L 21/4763
(52) U.S. Cl. .......................... 438/629; 438/630; 438/627; 438/633; 438/637; 438/643; 438/649; 438/682; 438/664
(58) Field of Search ..................................... 438/627–630, 438/632–633, 637–640, 643–646, 648–649, 651, 663–664, 682–683, 672, 675

(56) References Cited

U.S. PATENT DOCUMENTS 5,654,235 * 8/1997 Matsumoto et al. ................ 438/643
5,656,545 * 8/1997 Yu .......................................... 438/627
6,057,231 * 5/2000 Givens et al. ........................ 438/644

* cited by examiner

Primary Examiner—Charles Bowers
Assistant Examiner—Thanh Nguyen
(74) Attorney, Agent, or Firm—George O. Saile; Stephen B. Ackerman

(57) ABSTRACT

A process for forming a tungsten plug structure, in a narrow diameter contact hole, has been developed. The process features the use of a composite layer, comprised on an underlying titanium layer, and an overlying, first titanium nitride barrier layer, on the walls, and at the bottom, of the narrow diameter contact hole. After an RTA procedure, used to create a titanium silicide layer, at the bottom of the narrow diameter contact hole, a second titanium nitride layer is deposited, to fill possible defects in the underlying first titanium nitride, that may have been created during the RTA procedure. The tungsten plug structure is then formed, embedded by dual titanium nitride barrier layers.

19 Claims, 3 Drawing Sheets

TWO STEP BARRIER PROCESS

BACKGROUND OF THE INVENTION (1) Field of the Invention

The present invention relates to processes used to fabricate semiconductor devices, and more specifically to a process used to create a barrier layer, in a contact hole, prior to a tungsten deposition.

(2) Description of the Prior Art

The major objectives of the semiconductor industry is to continually increase the performance of semiconductor chips, while still reducing the fabrication costs, for these same semiconductor chips. Micro-miniaturization, or the ability to fabricate semiconductor devices, using sub-micron features, has allowed the performance and cost objectives to be successfully addressed. The use of smaller device features result in decreases in performance degrading capacitances. In addition the use of smaller device features result in the attainment of smaller semiconductor chips, still possessing circuit densities previously achieved with larger semiconductor chip counterparts, however enabling more chips to be realized from a specific size, starting substrate, thus reducing the processing cost of a specific chip.

The use of sub-micron features, such as contact holes with diameters less than 0.50 $\mu$m, can however present problems not prevalent with larger diameter contact holes. For example a contact hole opening, in an insulator layer, such as a bit line contact hole to an active device region in the semiconductor substrate, or openings to source/drain regions, of metal oxide semiconductor field effect transistor, (MOSFET), devices, such as static random access memory, (SRAM), or dynamic random access memory, (DRAM), devices, are difficult to successfully fill with an aluminum based layer, obtained via R.F. sputtering, or evaporation procedures. The non-conformality of the deposited aluminum layer, in the narrow diameter contact hole, can result in voids, present at the center of the contact hole, where the non-conformal, depositing layers, of aluminum on the sides of the contact hole did not properly converge. The voids in the aluminum fill can result in yield and reliability failures.

The use of chemically vapor deposited tungsten layers, exhibiting increased conformality, when compared to aluminum based counterparts, has allowed the successful filling of narrow diameter contact holes, to be realized. The use of tungsten filled, contact holes, or tungsten plugs, is characterized by the initial deposition of a titanium—titanium nitride, composite layer, on the walls of the contact hole, prior to tungsten deposition. Titanium offers excellent adhesion to underlying silicon oxide layers, while also supplying the metal, needed to create a metal silicide layer, via use of a subsequent anneal procedure. The metal silicide layer offers improved contact resistance between an overlying tungsten plug structure, in the narrow diameter contact hole, and an underlying active device region. The titanium nitride layer is used as a barrier layer to protect underlying titanium from the attack by the reaction products, generated from the chemical vapor deposition procedure used for deposition of the tungsten layer. However the anneal procedure used to form the metal silicide, the titanium silicide layer in this case, can create cracks or defects in the titanium nitride barrier layer, or in underlying insulator layers, thus reducing the effectiveness of this barrier layer, in protecting underlying materials from the subsequent tungsten deposition. In addition, if left unfilled, the cracks or defects in the titanium nitride barrier layer, and in the underlying insulator layers, would be filled with tungsten, which would be difficult to remove during a subsequent chemical mechanical polishing procedure, thus presenting possible leakage or shorts when subsequent overlying metal structures are formed on an insulator surface, comprised with tungsten filled cracks.

This invention will offer a solution to the unwanted tungsten filling of cracks and defects. After the anneal procedure, used to form the titanium silicide layer from a titanium titanium nitride composite layer, a second titanium nitride layer is deposited, prior to tungsten deposition. The second titanium nitride layer will deposit in any defect, or crack, in the first titanium nitride layer, thus protecting underlying materials from the reaction products of a subsequent tungsten deposition procedure. In addition the second titanium nitride layer will fill defects and cracks, in insulator layers, thus restricting the filling of these defects with tungsten, thus preventing leakage or shorting phenomena, when overlaid with metal structures. Prior art, such as Matsumoto et al. in U.S. Pat. No. 5,654,235, do not use a chemical mechanical polishing procedure to create a tungsten plug, but define a tungsten structure, via photolithographic and reactive ion etching, (RIE), procedures. The RIE procedure may allow any embedded tungsten to be removed, however adding cost and complexity to the fabrication sequence. In addition that prior art consumes the entire thickness of titanium, at the bottom of the contact hole, during formation of a titanium silicide layer, thus not realizing the lower contact resistance offered in this invention in which the titanium silicide layer is directly interfacing an overlying titanium layer.

SUMMARY OF THE INVENTION

It is an object of this invention to create a tungsten plug structure, in a narrow diameter contact hole.

It is another object of this invention to use a composite barrier—adhesive layer, comprised of a first titanium nitride barrier layer, on an underlying titanium adhesive layer, on the walls, as well as at the bottom, of the narrow diameter contact hole.

It is still another object of this invention to deposit a second titanium nitride layer on an underlying first titanium nitride layer, after an anneal procedure, performed to create a titanium silicide layer at the bottom of the narrow diameter contact hole, and prior to tungsten deposition.

In accordance with the present invention a process for forming a tungsten plug structure, in a narrow diameter contact hole, is described, in which a second titanium nitride barrier layer is used to fill defects, created in underlying materials during an anneal cycle, which in turn was used to form a titanium silicide layer at the bottom of the narrow diameter contact hole. After creation of: a gate structure, on an underlying gate insulator layer; a lightly doped source/drain region; insulator spacers on the sides of the gate structure; and a heavily doped source/drain region; a narrow diameter contact hole is opened in an interlevel dielectric, (ILD), layer, exposing a region of the heavily doped source/drain region. A composite layer, comprised of an underlying titanium layer, and an overlying, first titanium nitride layer, is deposited, coating the walls, as well as the bottom, of the narrow diameter contact hole. A rapid thermal anneal, (RTA), procedure is used to form a titanium silicide layer, on the heavily doped source/drain region, at the bottom of the narrow diameter contact hole. A second titanium nitride layer is deposited, overlying the first titanium nitride layer, and filling any defect or crack that may have been created in underlying materials during the RTA procedure. A chemically vapor deposited tungsten layer is next used to completely fill the narrow diameter contact hole, followed by a chemical mechanical polishing procedure, removing tungsten, second titanium nitride, first titanium nitride, and titanium, from the top surface of the ILD layer, resulting in a tungsten plug structure, in a narrow diameter contact hole, embedded in dual titanium nitride barrier layers.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a tungsten plug structure, in a narrow diameter contact hole, using dual barrier layers of titanium nitride, located on the walls of, as well as at the bottom of, a narrow diameter contact hole, will now be described in detail. This invention will be described for an N type, or NFET, MOSFET device. However this invention can also be applied to PFET or CMOS, (complimentary NFET and PFET), devices.

Figure 1:
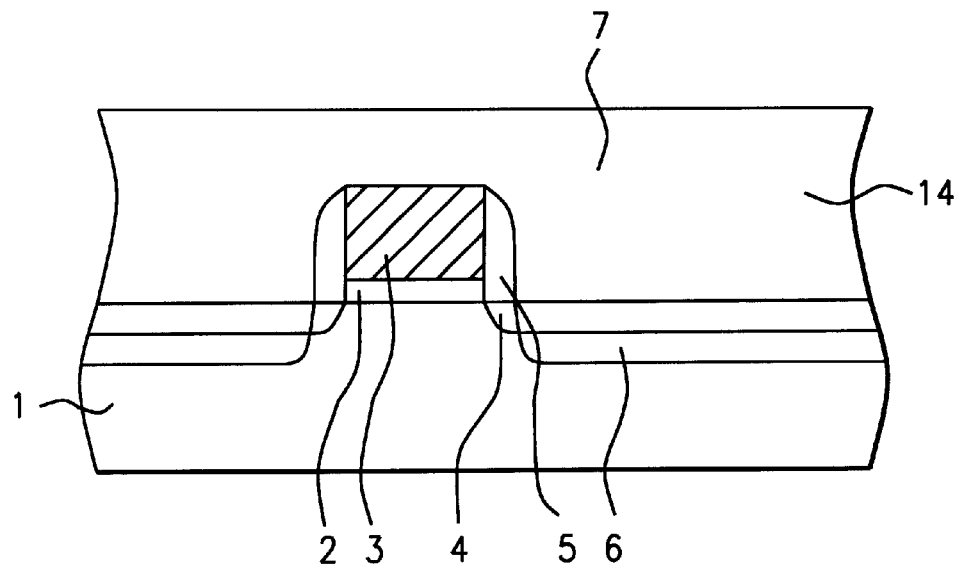
FIGS. 1–6, which schematically, in cross-sectional style, show the key stages of fabrication used to form a tungsten plug structure, in a narrow diameter contact hole, for a MOSFET device, where a dual barrier layers of titanium nitride, are used to envelop the tungsten plug, in the narrow diameter contact hole.

A P type, semiconductor substrate 1, comprised of single crystalline silicon, with a <100> crystallographic orientation, is used and schematically shown in FIG. 1. A silicon dioxide, gate insulator layer 2, is thermally grown in an oxygen-steam ambient, at a thickness between about 20 to 200 Angstroms. A polysilicon layer 3, is next deposited, via low pressure chemical vapor deposition, (LPCVD), procedures, to a thickness between about 1000 to 3000 Angstroms. Polysilicon layer 3, can be doped in situ, during deposition, via the addition of arsine, or phosphine, to a silane ambient, or polysilicon layer 3, can be deposited intrinsically, then doped via ion implantation of arsenic, or phosphorous ions. In addition, if lower word line resistance is desired, a polycide layer, comprised of a metal silicide layer, such as tungsten silicide, on an underlying polysilicon layer, can be used in place of polysilicon layer 3. Conventional photolithographic and RIE procedures, using $Cl_2$ as an etchant, are used to create the polysilicon, or polycide gate structure. The photoresist shape, used to define the gate structure, is removed via plasma oxygen ashing and careful wet cleans.

Lightly doped source/drain region 4, shown schematically in FIG. 1. is next formed via ion implantation of arsenic, or phosphorous ions, at an anergy between about 5 to 60 KeV, at a dose between about 1E13 to 3E14 atoms/$cm^2$. If a PFET device is being fabricated, lightly doped source/drain region 4, would be formed using boron, or $BF_2$, implanted ions. Insulator sidewall spacers 5, comprised of silicon oxide, or silicon nitride, are formed via LPCVD or plasma enhanced chemical vapor deposition, (PECVD), procedures, of a silicon oxide, or of a silicon nitride layer, at a thickness between about 600 to 2000 Angstroms. An anisotropic RIE procedure, using $CHF_3$ as an etchant for silicon oxide, (or using $CF_4$ as an etchant for silicon nitride), is used to create insulator spacers 5, on the gate structure. Heavily doped source/drain region 6, is next formed, again via ion implantation of arsenic, or phosphorous ions, at an energy between about 5 to 60 KeV, at a dose between about 1E15 to 6E15 atoms/$cm^2$. If a PFET device is being used, heavily doped source/drain region 6, would be created via ion implantation of boron, or $BF_2$ ions. An interlevel dielectric, (ILD), layer 14, shown schematically in FIG. 1, is next deposited via PECVD procedures. ILD layer 14, is comprised of an underlying silicon oxide layer, PETEOS, (plasma enhanced tetraethylorthosilicate), deposited to a thickness between about 1000 to 2000 Angstroms, and comprised of an overlying doped silicon oxide layer, BPTEQS, (boro-phospho.tetraethylorthosilicate), at a thickness between about 3000 to 12000 Angstroms. An anneal cycle is than used, at a temperature between about 750 to 900° C., to soften and reflow the BPTEOS layer, resulting in ILD layer 14, having a smooth top surface topography. This is schematically shown in FIG. 1.

Figure 2:
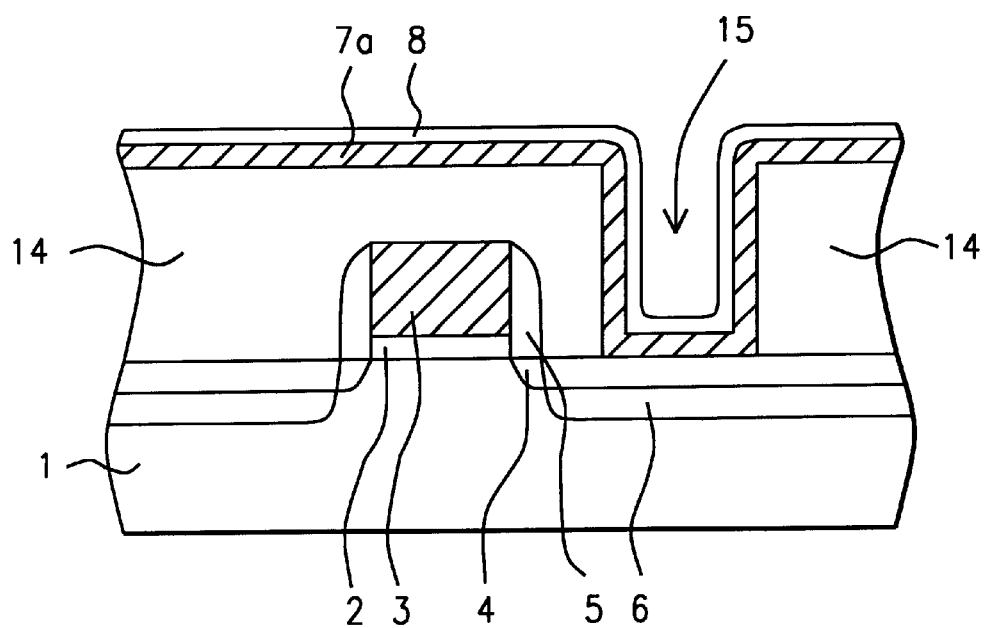

Conventional photolithographic and RIE procedures, using $CHF_3$ as an etchant for ILD layer 14, are employed to create narrow diameter contact hole 15, with a diameter between about 2000 to 6000 Angstroms, in ILD layer 14. Heavily doped source/drain region 6, is exposed at the bottom of narrow diameter contact hole 15. After removal of the photoresist shape, used to create narrow diameter contact hole 15, via plasma oxygen ashing and careful wet cleans, titanium layer 7a, is deposited at a thickness between about 100 to 400 Angstroms, using a plasma vapor deposition, (PVD), procedure, such as R.F. sputtering. Titanium layer 7a, is used to provide adhesion between a subsequent overlying structures, such as a tungsten plug structure, and ILD layer 14, as well as supplying the needed titanium, for subsequent formation of a titanium silicide layer. A first titanium nitride layer 8, is then obtained via a PVD procedure, such as R.F. sputtering, at a thickness between about 100 to 1000 Angstroms. The titanium nitride layer will serve as a barrier to protect titanium from the reaction products of a subsequent tungsten deposition procedure. The composite insulator layer, comprised of first titanium nitride layer 8, on titanium layer 7a, overlying the top surface of ILD layer 14, coating the sides of narrow diameter contact hole 15, and overlying the region of heavily doped source/drain 6, exposed at the bottom of narrow diameter contact hole 15, is schematically shown in FIG. 2.

Figure 3:
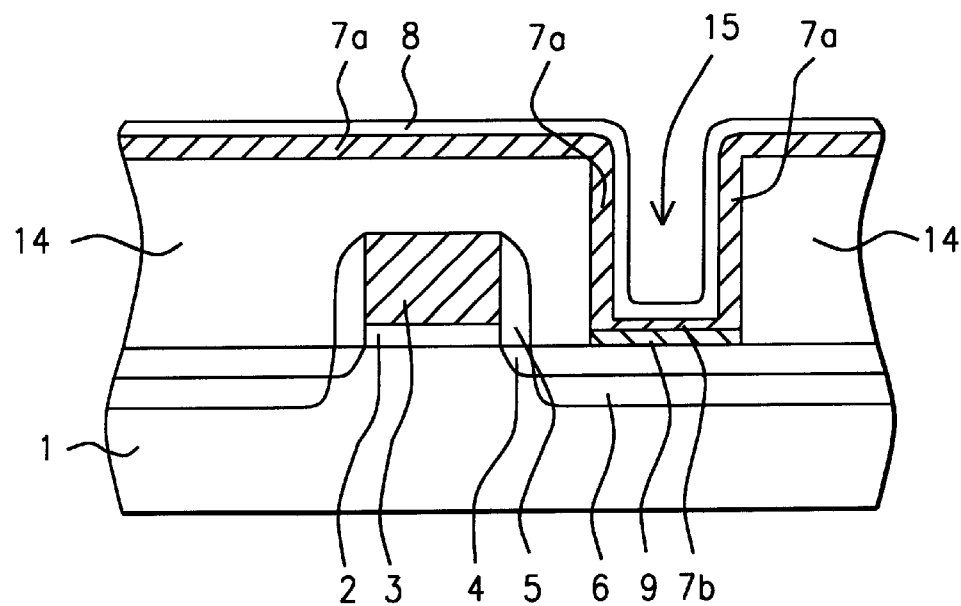

A RTA anneal procedure is next performed, at a temperature between about 600 to 750° C., for a time between about 15 to 60 sec., in a nitrogen ambient, to create titanium silicide layer 9, in the region in which titanium layer 7a, overlaid heavily doped source/drain region 6. The creation of titanium silicide layer 9, consumes a bottom portion of titanium layer 7a, resulting in a thinner titanium layer 7b, between about 50 to 200 Angstroms in thickness, located between overlying, first titanium nitride layer 8, and underlying titanium silicide layer 9. This is schematically shown in FIG. 3. The thermal excursion, experienced by the composite layer, comprised of first titanium nitride layer 8, and titanium layer 7a, during the RTA procedure, can result in defects or cracks, (not shown in the drawings), formed in titanium nitride layer 8, with the defects or cracks even extending into underlying materials, such as titanium, or the ILD layer. Subsequent deposition of a tungsten layer, via a conformal LPCVD procedure, can result in the unwanted filling of these cracks. If procedures used to subsequently remove unwanted regions of tungsten, do not in fact remove tungsten embedded in the cracks, subsequent metal structures, overlying tungsten filled cracks, can present unwanted leakage paths. In addition the defects or cracks can result in unwanted exposure, of underlying materials, to the by-products of the tungsten, LPCVD procedure.

Figure 4:
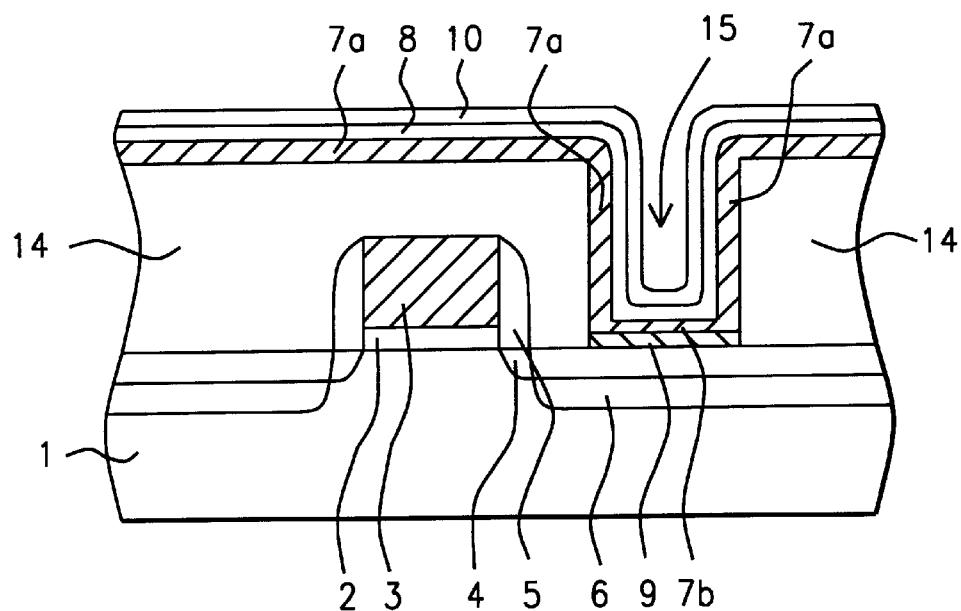
Figure 5:
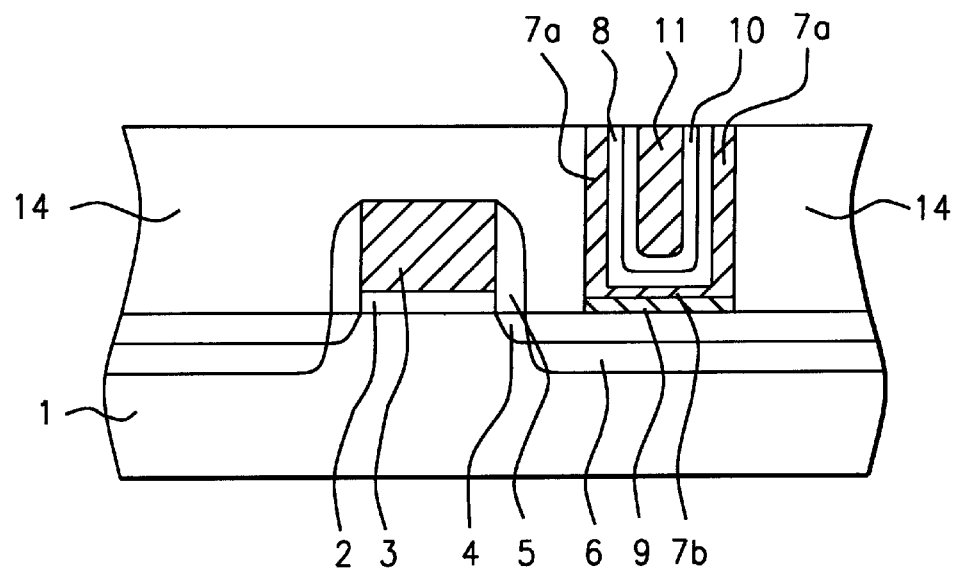

The process used to protect underlying materials from the tungsten deposition, as well as prevent tungsten filling of possible defects or cracks, is now described, and schematically shown using FIG. 4. A second titanium nitride layer 10, is deposited via a PVD procedure, such as R.F. sputtering, to a thickness between about 200 to 500 Angstroms. The use of second titanium nitride layer, will offer the barrier characteristics expected from first titanium nitride layer 8, which may have been compromised, in the form of cracks or defects, during the RTA procedure. A deposition of tungsten, via LPCVD procedures, at a temperature between about 400 to 500° C., to a thickness between about 3000 to 6000 Angstroms, is next performed, completely filling narrow diameter contact hole 15, overlying second titanium nitride layer 10. The reactants, as well as the by-products, of the tungsten deposition, performed using silane and tungsten hexafluoride, can not attack underlying materials, now protected by second titanium nitride layer 10. In addition any defects, or cracks, in underlying materials, are now filed with second titanium nitride layer, therefore not allowing filling by the depositing tungsten layer. A chemical mechanical polishing procedure is next used to remove the regions of tungsten, the regions of second titanium nitride layer 10, the regions of first titanium nitride layer 8, and the regions of titanium layer 7a, residing on the top surface of ILD layer 14, resulting in the creation of tungsten plug structure 11, in narrow diameter contact hole 15, embedded in second titanium nitride layer 10, as well as in the composite layer comprised of first titanium nitride layer 8, and titanium layer 7a. This is schematically shown in FIG. 5. In addition to removal of the unwanted regions of material, via a CMP procedure, the removal procedure can also be accomplished via a blanket, (without the use of photolithographic procedures), RIE procedure, using $Cl_2$ as an etchant.

Figure 6:
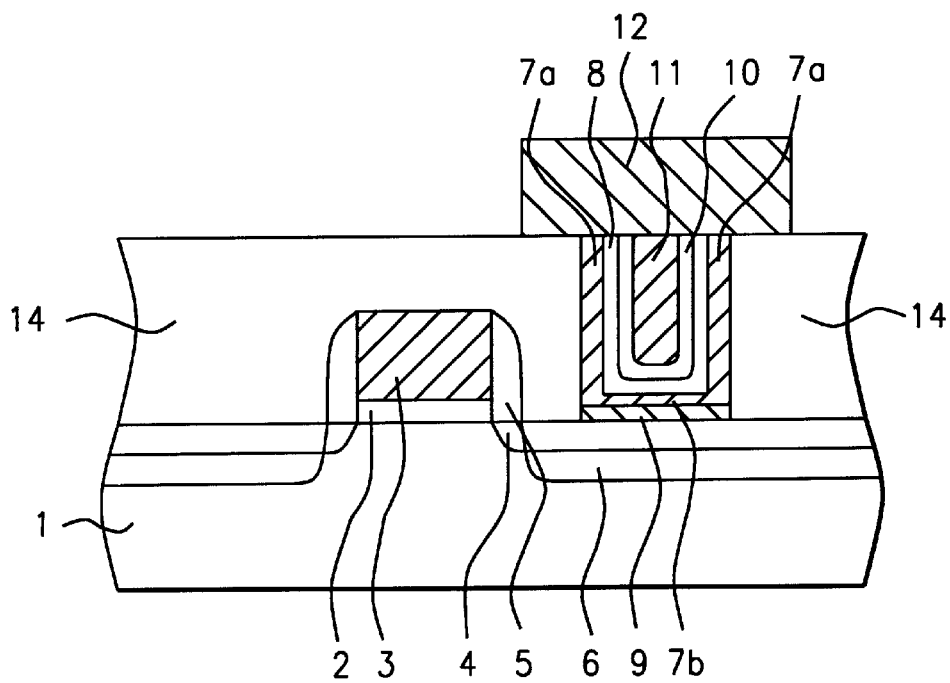

A metal interconnect structure 12, schematically shown in FIG. 6, is next formed, overlying tungsten plug structure 11, as well as overlying a portion of the top surface of ILD layer 14. Metal interconnect structure 12, can be comprised of an aluminum based metal, comprised with a small weight percent of copper, to enhance electromigration resistance, or metal interconnect structure 12, can be formed from a refractory metal layer, such as tungsten. After deposition of the metal layer, R.F. sputtering for the aluminum based layer, or LPCVD for the tungsten layer, conventional photolithographic and RIE procedures, using $Cl_2$ as an etchant, are used to define metal interconnect structure 12. The photoresist shape, used for definition of metal interconnect structure 12, is removed via plasma oxygen ashing and careful wet cleans. If metal interconnect structure 12, overlaid a defective region of ILD layer 14, the defect would have been filled with second titanium nitride layer 10, offering a less conductive, or less leaky situation, than would have existed with the absence of second titanium nitride layer 10, but with the presence of a tungsten filled defect.

While this invention has been particularly shown and described with reference to, the preferred embodiments thereof, it will be understood by those skilled in the art that various changes in form and details amy be made without departing from the spirit or scope of this invention.

What is claimed is:

1. A method of fabricating a MOSFET device, on a semiconductor substrate, using a metal filled, contact hole, to provide electrical contact between an overlying metal interconnect structure, and an underlying conductive region in said semiconductor substrate, comprising the steps of:

providing a gate structure, on an underlying gate insulator layer, with a source/drain region located in a region of said semiconductor substrate, not covered by the gate structure;

depositing an interlevel dielectric, (ILD), layer;

opening a narrow contact hole, with a diameter between about 2000 to 3000 Angstroms, in said ILD layer, exposing an area of said source/drain region, located at the bottom of said contact hole;

depositing an adhesive metal layer on the top surface of said ILD layer, on the walls of said narrow contact hole, and on the area of said source/drain region, exposed at the bottom of said narrow contact hole;

depositing a first barrier layer, on said adhesive metal layer;

performing an anneal procedure to form a metal silicide layer on said source/drain region, at the bottom of said narrow contact hole, with said metal silicide layer formed from a bottom portion of said adhesive metal layer, and from a top portion of said source/drain region, and with said anneal procedure creating cracks in said first barrier layer;

depositing a thin second barrier layer, between about 200 to 500 Angstroms, on said first barrier layers, and with said thin second barrier layer filling said cracks in said first barrier layer;

depositing a first; metal layer;

removing said first metal layer, said thin second barrier layer, said first barrier layer, and said adhesive metal layer, from the top surface of said ILD layer, resulting in a metal plug structure, in said contact hole, with said metal plug structure located between composite layers, located on the walls of said contact hole, with said composite layers comprised of said thin second barrier layer, of said first barrier layer, and of said adhesive metal layer, while said metal plug structure, also overlays a group of layers, at the bottom of said contact hole, comprised of said thin second barrier layer, of said first barrier layer, of a top portion of said adhesive metal layer, and of said metal silicide layer; and forming a metal interconnect structure, overlying and contacting, the top surface of said metal plug structure, and overlying a portion of the top surface of said ILD layer.

2. The method of claim 1, wherein said ILD layer is a composite insulator layer, comprised of an underlying silicon oxide layer, obtained via PECVD procedures, at a thickness between about 1000 to 2000 Angstroms, using TEOS as a source, and comprised of an overlying layer of a boro-phospho-TEOS, doped silicon oxide layer, obtained via PECVD procedures, at a thickness between about 3000 to 12000 Angstroms.

3. The method of claim 1, wherein said narrow contact hole, is formed in said ILD layer, via an anisotropic RIE procedure, using $CHF_3$ as an etchant.

4. The method of claim 1, wherein said adhesive metal layer, is a titanium layer, obtained via plasma vapor deposition, (PVD), procedures, such as R.F. sputtering, at a thickness between about 100 to 400 Angstroms.

5. The method of claim 1, wherein said first barrier layer, is a titanium nitride layer, obtained via PVD procedures, such as R.F. sputtering, at a thickness between about 100 to 1000 Angstroms.

6. The method of claim 1, wherein said anneal procedure, used to form said metal silicide layer, is a rapid thermal anneal procedure, performed at a temperature between about 600 to 750° C., for a time between about 15 to 60 sec., in a nitrogen ambient.

7. The method of claim 1, wherein said metal silicide layer, formed during said anneal procedure, from the bottom portion of said adhesive metal layer, and from the top portion of said source/drain region, is a titanium silicide layer.

8. The method of claim 1, wherein said thin second barrier layer is titanium nitride layer, obtained via PVD procedures, such as R.F. sputtering.

9. The method of claim 1, wherein said first metal layer is a tungsten layer, obtained via LPCVD procedures, at a temperature between about 400 to 500° C., at a thickness between about 3000 to 6000 Angstroms.

10. The method of claim 1, wherein said metal plug structure is formed in said contact hole, via removal of said first metal layer, from the top surface of said ILD layer, using a chemical mechanical polishing procedure.

11. A method of fabricating a MOSFET device, on a semiconductor substrate, using a tungsten plug structure, in a narrow diameter contact hole, to connect an overlying metal interconnect structure, to an underlying source/drain region, and with said narrow diameter contact hole, lined with two titanium nitride barrier layers, comprising the steps of:

providing a gate structure, on an underlying silicon dioxide gate insulator layer, with insulator spacers on the sides of the gate structure, and with a heavily doped source/drain region, located in an area of said semiconductor substrate, not covered by said gate structure, or by said insulator spacers;

depositing an ILD Layer;

reflowing of said ILD layer, creating a smooth top surface topography for said ILD layer;

opening said narrow diameter contact hole, between about 2000 to 6000 Angstroms in diameter, in said ILD layer, exposing a portion of said heavily doped source/drain region, at the bottom of said narrow diameter contact hole;

depositing a titanium adhesive layer, on the top surface of said ILD layer, on the walls of said narrow diameter contact hole, and on the portion of said heavily doped source/drain region, exposed at the bottom of said narrow diameter contact hole;

depositing a first titanium nitride barrier layer, on said titanium adhesive layer;

performing an RTA procedure, creating a titanium silicide layer at the bottom of said narrow diameter contact hole, with said titanium silicide layer formed from consumption of a bottom portion of said titanium adhesive layer, and from a top portion of said heavily doped source/drain region, and with said RTA procedure creating cracks in said first titanium nitride barrier layer;

depositing a thin second titanium nitride barrier layer, at a thickness between about 200 to 500 Angstroms, on said first titanium nitride barrier layers, and with said thin second titanium nitride barrier layer filling said cracks in said first titanium nitride barrier layer;

depositing a tungsten layer, on said thin second titanium nitride barrier layer, completely filling said narrow diameter contact hole;

performing a chemical mechanical polishing procedure, to remove regions of said tungsten layer, regions of said thin second titanium nitride barrier layer, regions of said first titanium nitride barrier layer, and regions of said titanium adhesive layer, from the top surface of said ILD layer, creating said tungsten plug structure, in said narrow diameter contact hole, with said tungsten plug structure located between composite layers, located on the walls of said narrow diameter contact hole, comprised of said thin second titanium nitride barrier layer, said first titanium nitride barrier layer, and said titanium adhesive layer, and with said tungsten plug structure, at the bottom of said narrow diameter contact hole, overlying said thin second titanium nitride barrier layer, said first titanium nitride barrier layer, a top portion of said titanium adhesive layer, and said titanium silicide layer; and forming a metal interconnect structure, overlying and contacting, the top portion of said tungsten plug structure, and overlying a portion of the top surface of said ILD layer.

12. The method of claim 11, wherein said ILD layer is comprised of an underlying, undoped silicon oxide layer, obtained via PECVD procedures, to a thickness between about 1000 to 2000 Angstroms, using TEOS as a source, and comprised of a doped silicon oxide layer, such as BPTEOS, (boro-phospho-TEOS), obtained via PECVD procedures, at a thickness between about 3000 to 12000 Angstroms, using TEOS as the source for the silicon oxide component of the BPTEOS layer.

13. The method of claim 11, wherein the reflowing of said ILD layer is performed at a temperature between about 750 to 900° C.

14. The method of claim 11, wherein said narrow diameter contact hole is formed in said ILD layer, via an anisotropic RIE procedure, using $CHF_3$ as an etchant.

15. The method of claim 11, wherein said titanium adhesive layer is obtained via PVD procedures, such as R.F. sputtering, to a thickness between about 100 to 400 Angstroms.

16. The method of claim 11, wherein said first titanium nitride barrier layer is obtained via PVD procedures, such as R.F. sputtering, to a thickness between about 100 to 1000 Angstroms.

17. The method of claim 11, wherein said RTA procedure, used to create said titanium silicide layer, is performed at a temperature between about 600 to 750° C., for a time between about 15 to 60 sec., in a nitrogen ambient.

18. The method of claim 11, wherein said thin second titanium nitride barrier layer is obtained via PVD procedures, such as R.F. sputtering.

19. The method of claim 11, wherein said tungsten layer is obtained via LPCVD procedures, at a thickness between about 3000 to 6000 Angstroms, using silane and tungsten hexafluoride as reactants.

* * * * *